(12) United States Patent
Berman

(10) Patent No.: US 11,120,871 B2
(45) Date of Patent: Sep. 14, 2021

(54) DENOISING OF INTRINSIC SNEAK CURRENT BY CELL LOCATION IN PRAM

(71) Applicant: SAMSUNG ELECTRONICS CO., LTD., Suwon-si (KR)

(72) Inventor: Amit Berman, Ramat Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 16/386,667

(22) Filed: Apr. 17, 2019

(65) Prior Publication Data

US 2020/0335160 A1 Oct. 22, 2020

(51) Int. Cl.
| | |
|---|---|
| G11C 11/00 | (2006.01) |
| G11C 13/00 | (2006.01) |
| G11C 29/52 | (2006.01) |
| G06N 20/00 | (2019.01) |
| G06F 11/10 | (2006.01) |
| G11C 11/56 | (2006.01) |

(52) U.S. Cl.
CPC ........ *G11C 13/004* (2013.01); *G06F 11/1068* (2013.01); *G06N 20/00* (2019.01); *G11C 13/0004* (2013.01); *G11C 13/0028* (2013.01); *G11C 29/52* (2013.01); *G11C 11/5678* (2013.01); *G11C 2013/0045* (2013.01)

(58) Field of Classification Search
CPC .............. G11C 13/004; G11C 11/5642; G11C 13/0069; G11C 16/0483; G11C 13/0004; G11C 16/26; G11C 16/10; G11C 2013/0045; G11C 29/52; G11C 13/0007; G11C 13/0028; G11C 29/028; G11C 8/08; G11C 11/1673; G11C 7/12; G11C 11/161; G11C 13/0061; G11C 13/003
See application file for complete search history.

(56) References Cited

U.S. PATENT DOCUMENTS

| | | | | |
|---|---|---|---|---|
| 7,505,334 | B1 * | 3/2009 | Breitwisch | .............. G11C 11/16 365/189.15 |
| 7,573,775 | B2 * | 8/2009 | Fallah | ..................... G11C 29/02 365/156 |
| 8,982,647 | B2 * | 3/2015 | Nazarian | .............. G11C 13/004 365/189.14 |
| 2007/0195616 | A1 * | 8/2007 | Fallah | ..................... G11C 29/02 365/194 |
| 2009/0073784 | A1 * | 3/2009 | Breitwisch | .......... G11C 11/5678 365/189.011 |
| 2009/0154215 | A1 * | 6/2009 | Parikh | ..................... G11C 5/063 365/63 |
| 2011/0038199 | A1 * | 2/2011 | Breitwisch | ......... G11C 13/0061 365/163 |

* cited by examiner

Primary Examiner — Hien N Nguyen
(74) *Attorney, Agent, or Firm* — F. Chau & Associates, LLC

(57) ABSTRACT

A method of denoising intrinsic sneak currents in a PRAM memory array of M wordlines and N bitlines includes receiving, by the PRAM memory array, an input read address; and selecting from a table of wordline distances from a sense-amplifier versus estimated optimal currents for those wordline distances an estimated optimal reference current for a distance closest to the received input read address. The reference current determines whether a read current is '0' or '1' and minimizes a bit error rate due to effects of sneak paths and parasitic elements that distorts the read current.

6 Claims, 11 Drawing Sheets

| WL Distance From Sense-Amp | Optimal BER Current Comparison |
|---|---|
| 1 | 0.495 |
| 2 | 0.490 |
| 4 | 0.480 |
| 8 | 0.462 |
| 16 | 0.430 |
| 32 | 0.377 |
| 64 | 0.302 |
| 128 | 0.217 |
| 256 | 0.138 |
| 512 | 0.080 |
| 1024 | 0.044 |

FIG. 7B

| WL Distance From Sense-Amp | Optimal BER Current Comparison |
|---|---|
| 1 | 0.495 |
| 2 | 0.490 |
| 4 | 0.480 |
| 8 | 0.462 |
| 16 | 0.430 |
| 32 | 0.377 |
| 64 | 0.302 |
| 128 | 0.217 |
| 256 | 0.138 |
| 512 | 0.080 |
| 1024 | 0.044 |

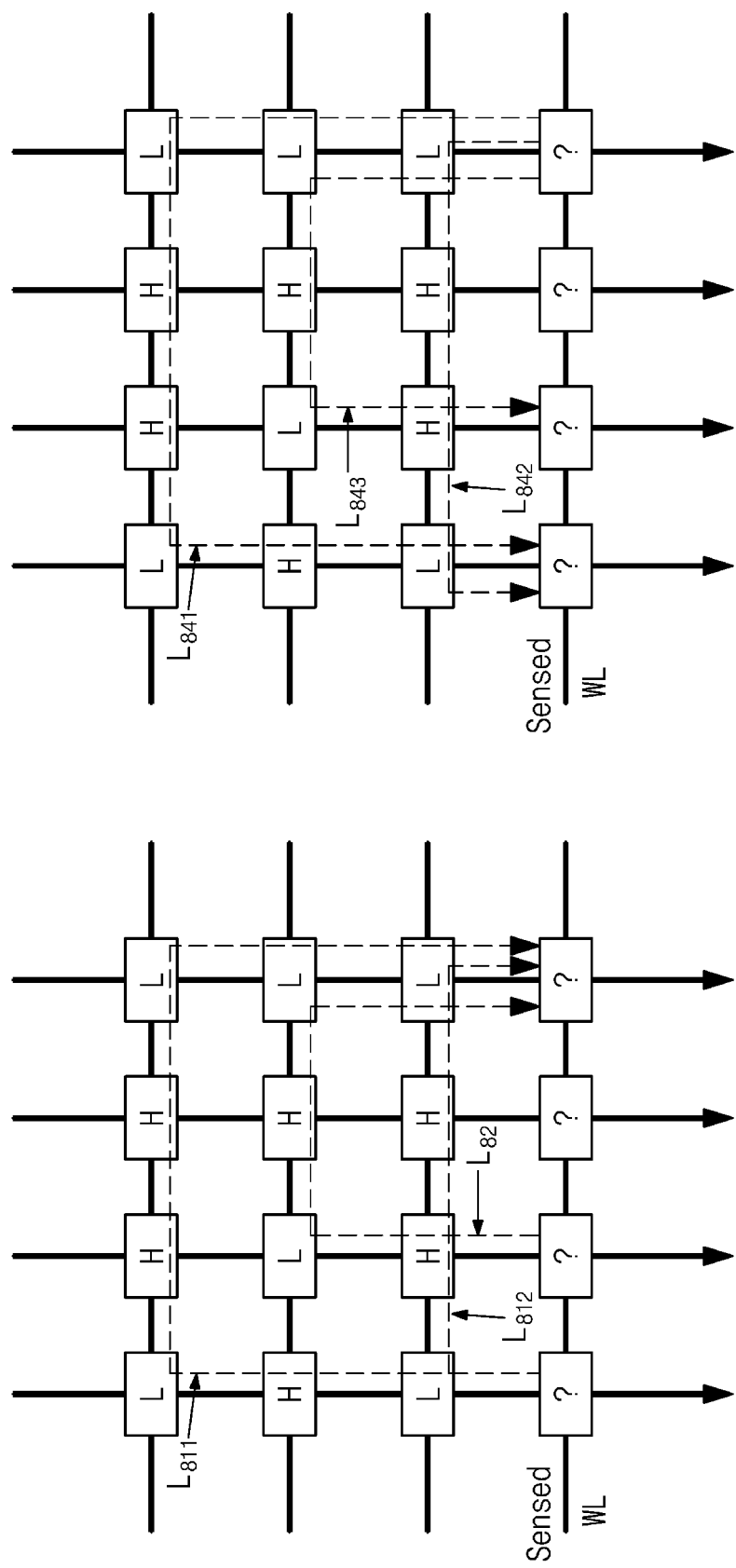

DENOISING OF INTRINSIC SNEAK CURRENT BY CELL LOCATION IN PRAM

TECHNICAL FIELD

Embodiments of the present disclosure are directed to methods for improving the reliability of read operations in phase change random access memory (PRAM).

DISCUSSION OF THE RELATED ART

Competitive emerging non-volatile memories focus on small cell sizes which trade-off signal-to-noise ratio and power dissipation. As market density race continues, error mechanisms and parasitic electrical elements are becoming more pronounced. Traditional manufacturing recipes are facing increasing difficulty in handling nano-scale issues. Therefore, systematic write and read algorithms need to be rethought.

PRAM cross-point array architecture is able to pack two-terminal resistive switching components into a high density vertical network, and has potential for smaller feature size than NAND flash architecture. However, the dimension reduction raises serious reliability and power concerns. Read operation in dense PRAM cross-point arrays is performed by estimating a cell's resistance according to a corresponding bitline current magnitude. The fundamental read signal noise is the sneak current which can be either added or subtracted from a sense amplifier input current. The sensed current contains a leakage component which is caused by the wordline-to-sense amplifier sneak paths. The parasitic effect can shift the output voltage signal and lead to data errors. The sneak pathways arrangements depend on the stored data, the location of the read wordline and array dimensions. It is considered as the main issue of data integrity and reliability. It can also cause unwanted power consumption in resistive elements of the sneak paths, which limit array scale.

An example of a sneak current in a 2×2 cross-point array is shown in FIG. 1. A selected wordline (row) is powered with $V_{WL}$, while the unselected row WL is connected to a high impedance, and the end of each bitline (column) is connected with near-zero input impedance to the sense amplifier. In the figure, $R_{WL}/R_{BL}$ are the wordline/bitline parasitic resistance per array wire unit, and $R_L/R_H$ are the low/high resistance states for PRAM device at LRS and HRS. The line $L_{11}$ marks the theoretical ideal current path through the low-resistance PRAM and wire parasitic. Note that a high-resistance PRAM is equivalent to an open connection. After flowing through memory device $R_L$, the current is split at the first junction: line $L_{12}$ is the desired read signal to target sense amplifier, and line $L_{13}$ is the sneak through same-wordline $R_L$ components and wire resistance to neighbor bitline, where there is no current due to a corresponding $R_H$ at the read wordline.

The magnitude of sneak current depends on the ratio between the bitline and sneak path resistances according to current divider theorem. It is an inherent phenomenon of cross-point resistor network. Various known methods can mitigate the sneak current at the cost of reduced storage capacity or increased power consumption. Those can be classified into two approaches: select device and coding.

A select device technique modifies the basic resistive element to be integrated with current control mechanism. Examples include diodes, MOSFET/BJT transistors and complementary resistive switches (CRS). In those cell designs, sneak current is significantly reduced, but the overhead cost in cell area and 3D/BEOL compatibility are high. Furthermore, transistors require additional address multiplexer wiring, diodes degrade a cell's output current signal magnitude, CRS has destructive readout, and 1-selector 1-resistor (1S1R) structures have high non-linearity ratios.

A coding technique utilizes error-correction codes (ECC) or their combination with constrained codes. Using only codes is feasible only if the bit error rate is low, e.g. $10^{-3}$ to $10^{-2}$. Otherwise, either soft data extraction or advanced low-power hard-decision ECC schemes are required to cope with increasing error rates. Multi-dimensional constrained coding can eliminate or reduce sneak current paths, but their parity bits redundancy is unacceptable.

SUMMARY

Exemplary embodiments of the present disclosure are directed to systems and methods for soft information extraction of wordline data during sequential read based on a denoising scheme to reduce the number of errors that result from sneak currents. It is noted that the number of sneak paths that end in a certain bitline is relative to the number of PRAM devices in low-resistance state that are placed in the same bitline, and that the sneak noise depends on wordline location and the number of low-resistance cells on the same bitline. Read margins on both high and low resistance cells are analyzed, and previous data reads in array matrix are used to assign bit likelihood estimation to future wordline reads. The gained reliability information can be used to denoise codeword data in hard decision decoding or to boost effective soft decision decoding at the controller. Algorithms according to embodiments of the disclosure do not require any bit redundancy, and hardware overhead is small and feasible. Analysis results show improvements of several magnitudes in bit error rate, and soft information can further enhance error correction and recovery. Algorithms according to embodiments are universal and can expand to fit any number of multiple bit cell (MLC) levels. Algorithms according to embodiments are flexible and can be combined with other noise mitigation techniques. The requirement for device-aware error-correction is becoming more crucial as technology advances and more cells are stuffed in specific area for cost reduction.

According to an embodiment of the disclosure, there is provided a method of denoising intrinsic sneak currents in a PRAM memory array of M wordlines and N bitlines that includes receiving, by the PRAM memory array, an input read address; and selecting an estimated optimal reference current for a distance closest to the received input read address. The reference current determines whether a read current is '0' or '1' and minimizes a bit error rate due to effects of sneak paths and parasitic elements that distorts the read current.

According to a further embodiment of the disclosure, the estimated optimal reference current for a distance closest to the received input read address is selected from a table of wordline distances from a sense-amplifier versus estimated optimal currents for those wordline distances.

According to a further embodiment of the disclosure, the method includes generating the table of wordline distances from a sense-amplifier versus estimated optimal currents by calculating, for a plurality of wordline distances from a se-amplifier, a current $I(y_1)$ from $$I(y_1) = \frac{1}{2}\left(1 - \frac{zNy_1R_{BL}}{zNy_1R_{BL} + (N+\alpha)R_L} + \frac{2zy_1R_{BL}}{MNy_1R_{BL} + \beta(N+\alpha)R_L}\right)I_{RR},$$

wherein $R_{BL}$ is a resistance per unit space of a bitline, $R_L$ is a resistance of a low-resistance cell state of the PRAM, $1/\alpha$ is a constant fraction of low-resistance state cells in a wordline, $\beta$ is a constant fraction of low-resistance state cells in a bitline, and IRR is a current through a sensed low-resistance cell of the PRAM.

According to a further embodiment of the disclosure, the method includes log-regressing the currents $I(y_1)$ and distances $y_1$ to determine $I(y_1)$ as a linear function of the $\ln(y_1)$ of the form $I(y)=A-B \ln(y)$, wherein A and B are derived from the log-regression.

According to a further embodiment of the disclosure, the equation $$I(y_1) = \frac{1}{2}\left(1 - \frac{zNy_1R_{BL}}{zNy_1R_{BL} + (N+\alpha)R_L} + \frac{2zy_1R_{BL}}{MNy_1R_{BL} + \beta(N+\alpha)R_L}\right)I_{RR}$$

is derived from experimental data using machine learning.

According to a further embodiment of the disclosure, the estimated optimal reference current for a distance closest to the received input read address is selected by a dynamically changing machine learning technique.

According to another embodiment of the disclosure, there is provided a method of denoising intrinsic sneak currents in a PRAM memory array of M wordlines and N bitlines, including receiving, by the PRAM memory array, a number $Z_i$ of low-resistance state PRAMS per bitline i; assigning to a bit at index i a likelihood value of MN+1 when $Z_i$=0 or a likelihood value of $MN/Z_i\alpha$ when $Z_i \neq 0$, wherein $1/\alpha$ is a constant fraction of low-resistance state cells in a wordline; and decoding the bit at index i based on its likelihood value, wherein a denoised correct bit value is obtained.

According to a further embodiment of the disclosure, the step of assigning a likelihood value to a bit at index i is performed for all bits in a page.

According to a further embodiment of the disclosure, decoding the bit at index i based on its likelihood value is performed using an error-correcting code.

According to another embodiment of the disclosure, there is provided a method of denoising intrinsic sneak currents in a PRAM memory array of M wordlines and N bitlines, including generating a table of wordline distances from a sense-amplifier versus estimated optimal reference currents by calculating, for a plurality of wordline distances $y_1$ from a sense-amplifier, a current $I(y_1)$ from $$I(y_1) = \frac{1}{2}\left(1 - \frac{zNy_1R_{BL}}{zNy_1R_{BL} + (N+\alpha)R_L} + \frac{2zy_1R_{BL}}{MNy_1R_{BL} + \beta(N+\alpha)R_L}\right)I_{RR},$$

wherein $R_{BL}$ is a resistance per unit space of a bitline, $R_L$ is a resistance of a low-resistance cell state of the PRAM, $1/\alpha$ is a constant fraction of low-resistance state cells in a wordline, $\beta$ is a constant fraction of low-resistance state cells in a bitline, and IRR is a current through a sensed low-resistance cell of the PRAM, wherein the optimal reference current determines whether a read current is '0' or '1'.

According to a further embodiment of the disclosure, the method includes receiving, by the PRAM memory array, an input read address; and selecting, from the table of wordline distances from a sense-amplifier versus estimated optimal currents for those wordline distances, an estimated optimal reference current for a distance closest to the received input read address. The reference current minimizes a bit error rate due to effects of sneak paths and parasitic elements that distorts the read current.

According to a further embodiment of the disclosure, the method includes log-regressing the currents $I(y_1)$ and distances $y_1$ to determine $I(y_1)$ as a linear function of the $\ln(y_1)$ of the form $I(y)=A-B \ln(y)$, wherein A and B are derived from the log-regression.

According to a further embodiment of the disclosure, the equation $$I(y_1) = \frac{1}{2}\left(1 - \frac{zNy_1R_{BL}}{zNy_1R_{BL} + (N+\alpha)R_L} + \frac{2zy_1R_{BL}}{MNy_1R_{BL} + \beta(N+\alpha)R_L}\right)I_{RR}$$

is derived from experimental data using machine learning.

BRIEF DESCRIPTION OF THE DRAWINGS

FIGS. 7A and 7B is a graph and a table of output from Algorithm 1 on the parameters of FIG. 5, according to an embodiment of the disclosure.

FIG. 8 illustrates output of Algorithm 2 in a 4×4 PRAM array, according to an embodiment of the disclosure.

DETAILED DESCRIPTION OF EXEMPLARY EMBODIMENTS

Figure 1:
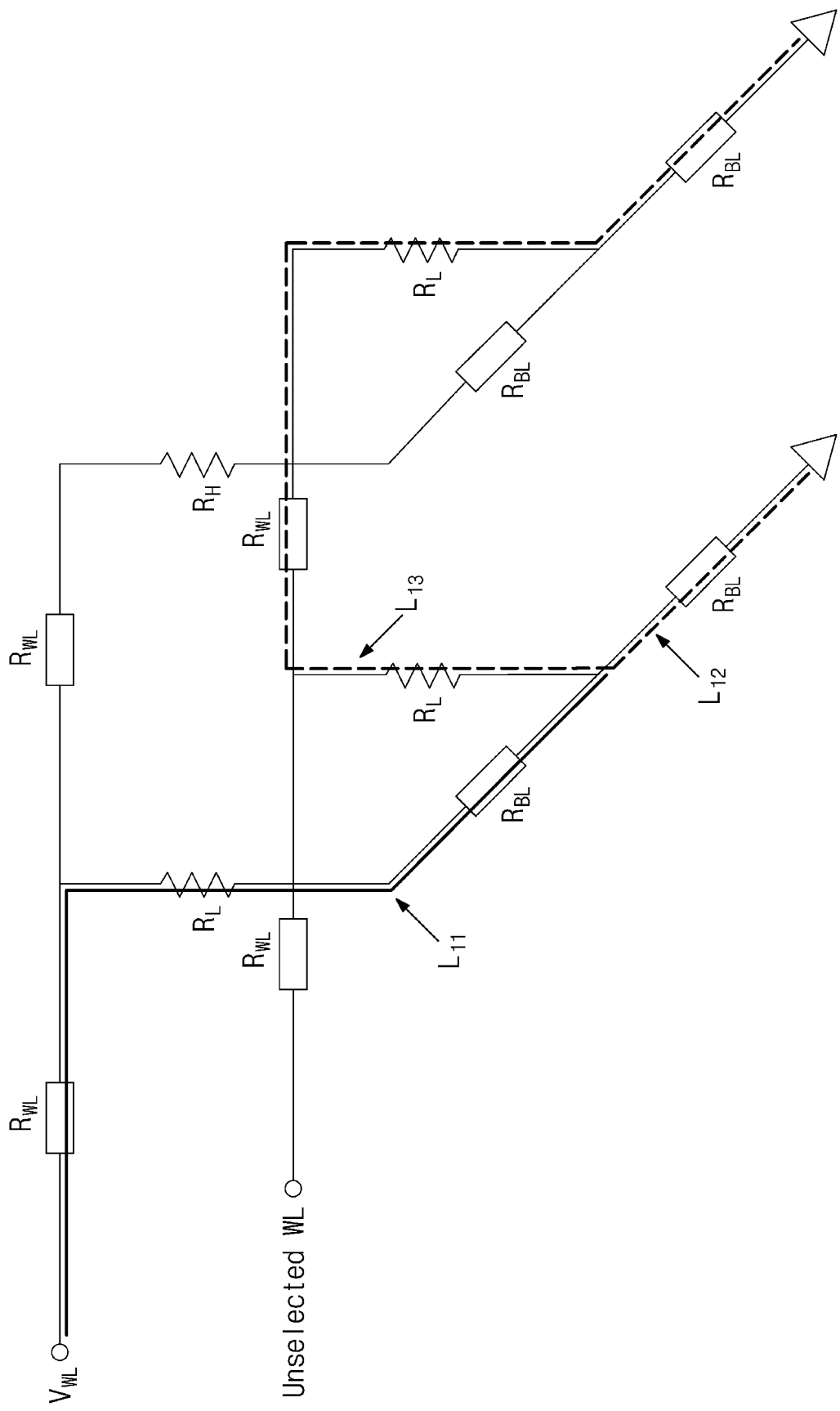
FIG. 1 shows an example of sneak current phenomena in a 2×2 cross-point PRAM, according to an embodiment of the disclosure.

Exemplary embodiments of the disclosure as described herein generally provide systems and methods for improving the reliability of read operations in phase change random access memory (PRAM). While embodiments are susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

A. Notations

Notation 1 (Cross-Point M×N Array Matrix): the number of wordlines (WL or rows) and bitlines (BL or columns) in a memory array is denoted with M and N respectively. The vertical cross-point array is built in consecutive wordlines and bitlines layers. The depth of a 3D structure is the number of stacked cross wires sheets.

Notation 2 (Wordline/Bitline Wires Parasitic Resistance): A memory array is built up from 3-dimensional (3D) wires. The resistance per unit space of WL or BL is denoted by $R_{WL}$ and $R_{BL}$.

Notation 3 (PRAM Levels per Cell): According to embodiments of the disclosure, a single bit per cell (SLC) is assumed. The cells states are either low- or high-resistance state LRS-1 or HRS-0, marked with resistances $R_L$ or $R_H$ resistances.

Notation 4 (First-Order Sneak Path): The sneak current is the portion of bitline's current that does not flow through target PRAM. The sneak path can include two or more PRAM devices. According to embodiments of the disclosure, only paths with two resistive memory devices are considered, referred as first-order sneak path. Other paths that contain more PRAMs have negligible currents.

Notation 5 (Statistical Distribution of LRS/HRS PRAMs): According to embodiments of the disclosure, the constant fraction of LRS cells in a wordline is denoted by $1/\alpha$, such that the absolute number of cells is $N/\alpha$, and correspondingly, $1/\beta$ per bitline ($M/\beta$ cells). The HRS cells complement the wordline/bitline cells. Note that $\alpha$ can be guaranteed by wordline coding, but making $\beta$ constant requires multi-dimensional constraints. According to embodiments of the disclosure, an independent and identically distributed Bernoulli data distribution with $\rho=\frac{1}{2}$ that uses a randomizer is assumed, therefore $\alpha=2$ and $\beta$ depends on array size: $\beta$ is a random variable with high variance in small arrays, and $\beta=2$ in large arrays.

B. Sneak Path Equivalent Circuit

According to embodiments of the disclosure, electrical modeling and analysis of sneak paths is described in the following section, along with design observations arising therefrom.

Figure 2:
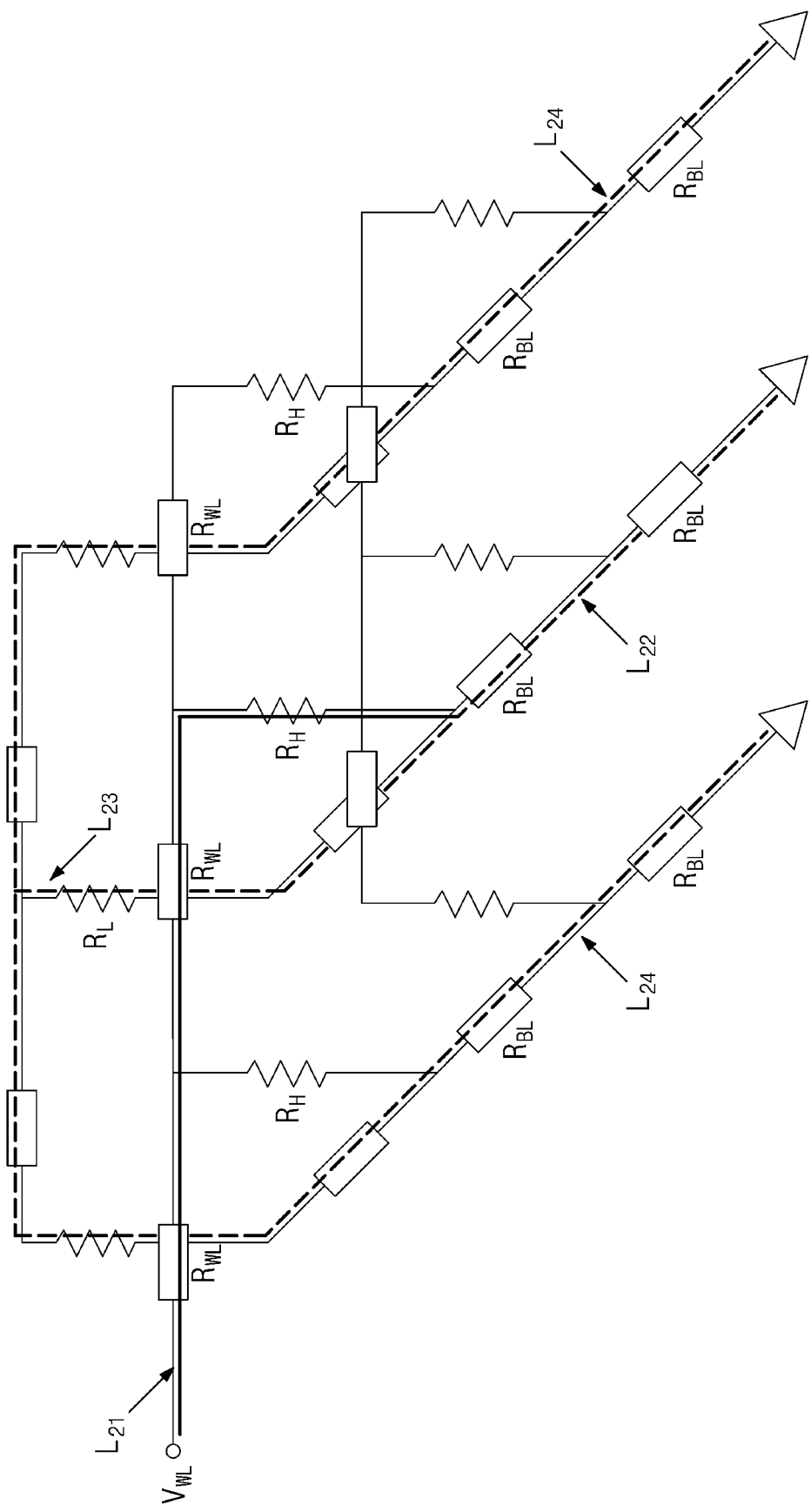
FIG. 2 shows current paths from a single PRAM device, according to an embodiment of the disclosure.

The effect of a wordline power supply on a single PRAM cell and its sneak current paths can be determined according to the super-position circuit analysis principle. The accumulated impact can be calculated by counting the individual effect of the wordline voltage on a single cell. The current path is divided into sub-paths, as shown in FIG. 2, which illustrates current paths from a single PRAM device. In a 3×3 array with vertical/horizontal lines for WL/BL, the centered LRS PRAM current is traced. The considered first order sneak-path contains two PRAMs at LRS that are not part of an ideal current path. The first path is the line $L_{21}$ from the voltage source to resistor bottom electrode. When reaching the bitline, the current is split. The line $L_{22}$ is the ideal path from the sensed PRAM to target sense-amplifier. The line $L_{23}$ is the split current to the other LRS top-electrode PRAM that is placed on the same-BL and other-WL then the one being read, which corresponds to subtractive noise. The last path is the line $L_{24}$ from the other-WL PRAM to the other-BL sense-amplifier, which corresponds to additive noise.

The path elements are described as follows and corresponding electrical modeling is given at FIG. 3, which illustrates electrical modeling of sneak path from a single LRS PRAM. The left side of the figure illustrates sneak path segments circuits, labeled with the same reference numbers as in FIG. 2, while the right side of the figure illustrates equivalent circuits of voltage-source to sense-amplifier through a single low-resistance device. $V_{WL}$ denotes the wordline power supply, $R_L$ is the resistance of LRS PRAM, $R_{BL}$ is unit length bitline resistance between two PRAM junctions, $y_1$ is the distance from the sense-amplifier, measured in the bitline wire length-unit, and SA is the sense-amplifier. Array dimensions are M wordlines (rows) and N bitlines (columns). The number of LRS cells per wordline is $N/\alpha$. The constants $x_1$, $y_2$ and $y_3$ in the figure are described in the following.

1. Wordline Voltage Source to Target PRAM

According to an embodiment, a starting path is from the read voltage source, through the parasitic wordline resistance and ends at the target PRAM bottom electrode as shown in the line $L_{21}$ in FIG. 2. The electrical modeling is shown in the left side of FIG. 3 as part of the whole sneak path configuration. The wordline resistance per length unit $R_{WL}$ is multiplied by constant parameter $x_1$ due to the distance of the PRAM from the voltage source.

2. PRAM Bottom Electrode to Sense-Amp

According to an embodiment, an ideal current path extends from the sensed PRAM through the bitline's parasitic resistance $R_{BL}$ to intended sense-amplifier, as depicted with the line $L_{22}$. The $R_{BL}$ is multiplied by constant $y_1$ due to the PRAM's distance from the sense-amplifier.

3. PRAM Bottom Electrode to Up-Flowing Other—WL RL

According to an embodiment, the sneak current path begins with a current split from the target PRAM bottom contact to another PRAM in the same wordline, as shown by the line $L_{23}$. The depicted bitline's resistance RBL is multiplied by $y_2$ for wire length.

4. Other-WL $R_L$ to Other-BL Sense-Amp

According to an embodiment, a final part of the sneak current is split from up-flowing other-WL $R_L$ corresponding to line $L_{24}$ of FIG. 2 to all PRAMs at LRS in the same wordline and reaches their bitline's sense-amps. The bitline resistance is multiplied by $y_3$ to account for its length.

Upon completing a sneak path model according to an embodiment of a single up-flowing other-WL PRAM $L_{23}$, it is converted to an equivalent circuit, and $R_{WL}$ and $R_{BL}$ can be neglected when those are attached to $R_L$. An equivalent resistance of path $L_{21}$ is $R_L$, path $L_{22}$ is $y_1 R_{BL}$, path $L_{23}$ is $R_L$. Assuming that there are $N/\alpha$ LRS PRAMs in path $L_{24}$ other-WL, the resulting resistance is:

$$R_{pathL_{24}} = \frac{1}{\sum_{N/\alpha} \frac{1}{R_L}} = \frac{\alpha}{N} R_L \qquad (1)$$

Figure 3:
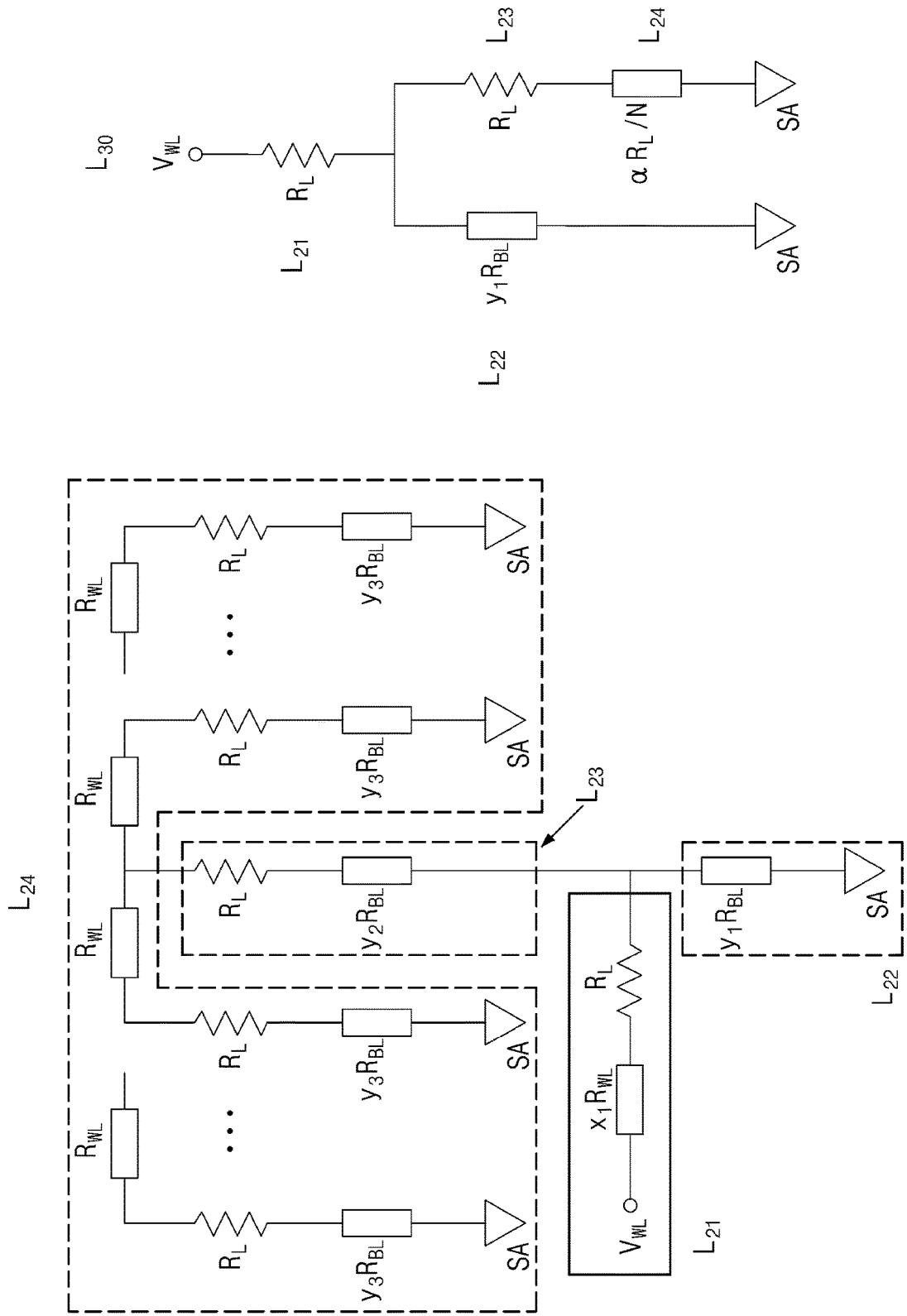
FIG. 3 illustrates electrical modeling of a sneak path from a single LRS PRAM, according to an embodiment of the disclosure.

A schematic of an equivalent circuit according to an embodiment is shown in the right side of FIG. 3.

Next, according to an embodiment, the circuit $L_{30}$ of the right side of FIG. 3 is generalized to all IRS devices in the same bitline. The expansion is circuit 14 shown in the left side of FIG. 4. The number of $(1+\alpha/N)R_L$ branches equals the number of LRS PRAMs per bitline and counted as $M/\beta$. Assuming that there are $M/\beta$ LRS PRAM column-wise, the corresponding resistance is:

$$R_{pathL_{30}} = \frac{1}{\sum_{m/\beta} \left(1 + \frac{\alpha}{N}\right) R_L} = \frac{\beta(N+\alpha)}{MN} \qquad (2)$$

Figure 4:
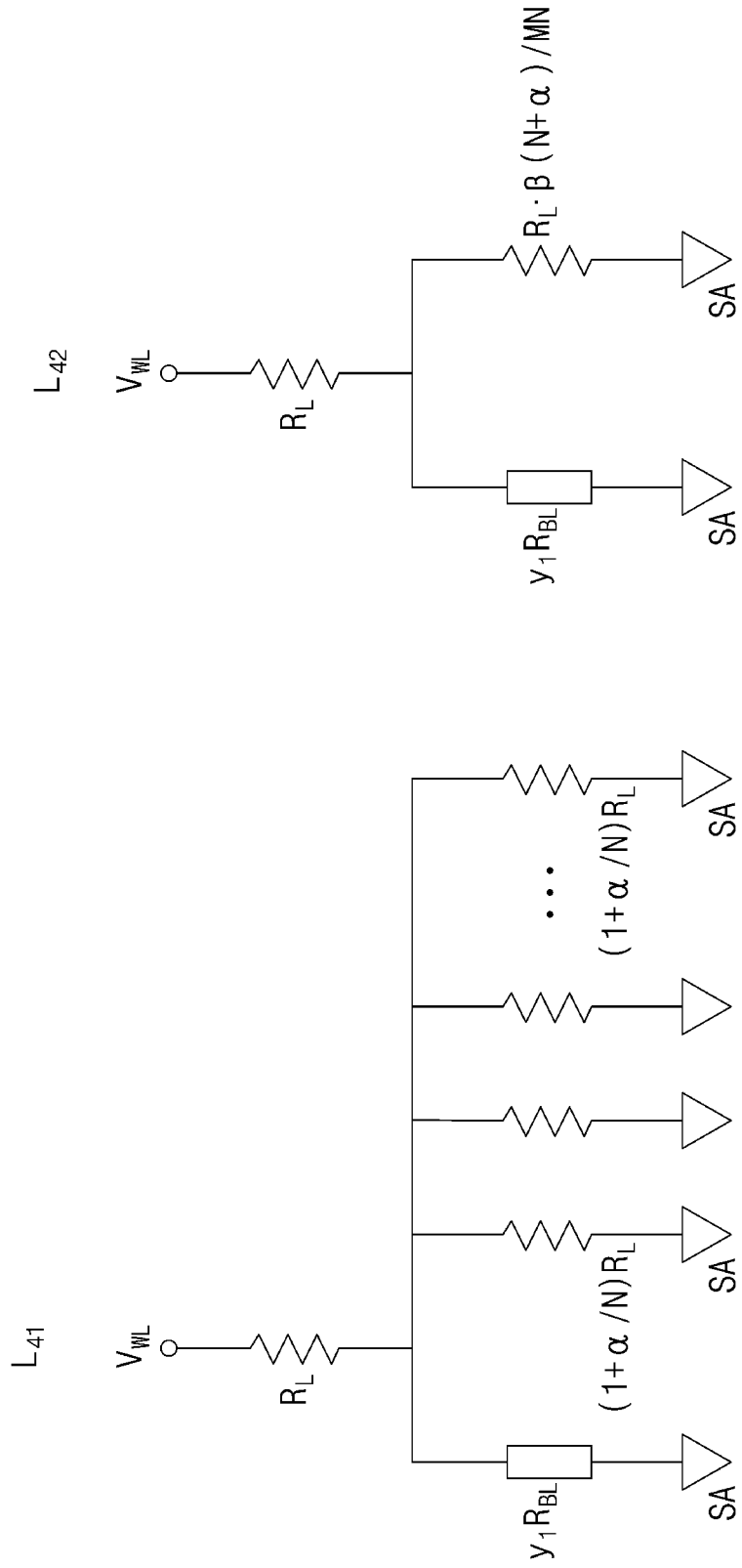
FIG. 4 illustrates an equivalent circuit of a sneak path, according to an embodiment of the disclosure.

The complete equivalent circuit $L_{42}$ is shown in the right side of FIG. 4. Denoting the current though sensed $R_L$ PRAM as $I_{RR}$, the achieved signal according to a current divider expression according to an embodiment is:

$$I_{sneak-RR} = \frac{y_1 R_{BL}}{\frac{\beta(N+\alpha)}{MN}R_L + y_1 R_{BL}} I_{RR} \quad (3)$$

$$= \frac{1}{1+\frac{\beta(N+\alpha)}{MNy_1}\frac{R_L}{R_{BL}}} I_{RR}$$

$$= \frac{1}{\frac{MNy_1 R_{BL} + \beta(N+\alpha)R_L}{MNy_1 R_{BL}}} I_{RR}$$

$$= \frac{MNy_1 R_{BL}}{MNy_1 R_{BL} + \beta(N+\alpha)R_L} I_{RR}$$

The analysis shows that the escaping current of a single bitline depends on array dimensions (M, N), data distribution ($\alpha$, $\beta$), LRS and bitline wire resistance ($R_L$, $R_{BL}$) and wordline distance from sense-amplifier ($y_1$).

It can be seen that if there are zero LRS devices in the bitline, equivalent to $\beta \to \infty$, the sneak current is eliminated. The current though the PRAM is:

$$I_{RR} = V_{WL} / \left( R_L + \frac{y_1 R_{BL} \cdot \frac{\beta(N+\alpha)}{MN}R_L}{y_1 R_{BL} + \frac{\beta(N+\alpha)}{MN}R_L} \right) \approx V_{WL}/R_L \quad (4)$$

The magnitude of the sneak current from a single PRAM device is with direct relation to:

$$I_{sneak-RR} \propto \frac{MNy_1}{\beta(N+\alpha)} \quad (5)$$

The total array sneak current is the sum of all LRS PRAMs on the same wordline, hence a sum over $N/\alpha$:

$$I_{sneak-Array} = \sum_{N/\alpha} \frac{1}{1 + \frac{\beta(N+\alpha)R_L}{MNy_1 R_{BL}}} I_{RR} \quad (6)$$

$$= \frac{y_1 R_{BL}}{\alpha} \frac{MN^2}{MNy_1 R_{BL} + \beta(N+\alpha)R_L} I_{RR}$$

When incrementing the wordlines (M) with fixed bitlines:

$$\lim_{M \to \infty} -I_{sneak-Array} = \frac{N}{\alpha} I_{RR} \quad (7)$$

On the other hand, increasing the number of bitlines (N) with fixed wordlines yields:

$$\lim_{N \to \infty} I_{sneak-Array} = \infty. \quad (8)$$

According to an embodiment, the array's sneak current magnitude function increases monotonically with M and N. The $I_{sneak-RR}$ current is associated with a sensed read signal and has impacts reliability. It can be viewed as the percentage of current that is subtracted from the device current. The $I_{sneak-Array}$ current is the total current that is re-distributed according to sneak-paths. It is added to all bitlines currents, including bitlines with HRS in the sensed wordline, considering the resistance and current divider theorem. In total, there are MN/$\alpha$ LRS PRAMs per array, and M/$\beta$ LRS components per bitline, and the additive current is:

$$I_{additive-RR} = \frac{M\alpha}{MN\beta} \frac{y_1 R_{BL}}{\alpha} \frac{MN^2}{MNy_1 R_{BL} + (N+\alpha)\beta R_L} I_{RR} \quad (9)$$

$$= \frac{y_1 R_{BL}}{\beta} \frac{MN}{MNy_1 R_{BL} + (N+\alpha)\beta R_L} I_{RR}$$

$$= \frac{1}{\beta + \frac{\beta^2(N+\alpha)R_L}{MNy_1 R_{BL}}} I_{RR}$$

The additive current is zero if all PRAMs in the bitline are HRS, which corresponds to $\beta \to \infty$. In random data distributions, the number of LRS devices per bitline is M/$\beta$ on average. In the case of a specific bitline with z LRS components:

$$R_{pathL_{30}} = \frac{1}{\Sigma_z \left(1+\frac{\alpha}{N}\right)R_L} = \frac{N+\alpha}{zN}R_L \quad (10)$$

$$I_{sneak-RR} = \frac{y_1 R_{BL}}{\frac{N+\alpha}{zN}R_L + y_1 R_{BL}} I_{RR} = \frac{1}{1+\frac{N+\alpha}{zN}\frac{R_L}{y_1 R_{BL}}} I_{RR} \quad (11)$$

The rest of the array is assumed to have N/$\alpha$ and M/P LRS PRAMs in WL/BL average. The additive effect in a specific bitline is:

$$I_{additive-RR} = \frac{z\alpha}{MN} \frac{y_1 R_{BL}}{\alpha} \quad (12)$$

$$= \frac{MN}{MNy_1 R_{BL} + (N+\alpha)\beta R_L} I_{RR}$$

$$= z \frac{y_1 R_{BL}}{MNy_1 R_{BL} + (N+\alpha)\beta R_L} I_{RR}$$

According to an embodiment, the PRAM and total array sneak current expressions and schematic equivalent circuit enable four distinct observations:

1. The Number of WLs has More Reliability Impact than BLs.

According to embodiments, increasing the number of wordlines (M) amplifies sneak current by 1/(1+1/M). However, increasing the number of bitlines (N) changes a specific PRAM current by factor of 1/(1+N/(N+$\alpha$)). When N is large, i.e. N>>$\alpha$, the effect of N on sensed signal is negligible.

2. Sneak Current Noise Magnitude Depend on WL Location.

According to embodiments, as can be seen by the $y_1$ element in $I_{sneak-RR}$, a wordline that is close to the sense amplifier will have a proportional reduction in sneak current. This depends on the sense-amplifier input impedance being sufficiently low so that the bitline's unit length resistance, in this case, the WL location, would have no meaningful effect on the sensed current.

3. The Total Array Sneak Current is Affected Differently by the Number of WLs Vs. BLs in a Small-Sized Array and Relatively Equally in a Large-Sized Array.

According to an embodiment, from an array point of view, wordlines affect sneak current by a factor of $1/(1+1/M)$ while bitlines (N) amplifies current by a factor of N in small arrays. When M and N are large, e.g. >100, the difference between increasing M or N is negligible.

4. The Additive Sneak Current to Specific Bitline is Proportional to its Number of LRS PRAMs Placements.

According to an embodiment, according to part-4 of the sneak path, the current is split to the LRS device's bitlines in each wordline. In large arrays with random data distribution, the current is averaged equally to each bitline, while in small arrays there can be significant difference between additive sneak current noise.

Based on the above insights, proper signal processing schemes according to embodiments are derived at the next section.

C. Denoising of Sneak Current

According to embodiments, observations 2 and 4 above, are used to develop algorithms for soft information extraction and denoising of sneak current. These algorithms would be executed by the memory controller associated with the PRAM chip, although the algorithms can also be implemented on-chip in the PRAM itself.

According to an embodiment, consider the read current signal. The current that flows through the sensed PRAM is $I_{RR}$, approximately $V_{WL}/R_L$, as calculated above, as the current through $R_H$ can be assumed to be negligible. The sensed current may equal $I_{RR}$. However, as shown above in the sneak path analysis, part of the current is diverted to other paths, referred to as $I_{sneak-RR}$. The sneak fraction is a subtractive noise from the original $I_{RR}$ signal. This noise depends on static array parameters, e.g. M, N, $R_L$, $R_{BL}$, and also on dynamic values, e.g. $\alpha$, $\beta$ of the data and the distance from the sense-amp $y_1$. In large arrays, $\alpha$, $\beta$ are approximately constant, therefore the noise depends mainly on $y_1$. The sneak RR currents are collected from all LRS PRAMs in the same wordline and re-distributed to all bitlines, including the ones with HRS, according to array data distributions. The added current is an additive noise referred to as $I_{additive-RR}$ and operation depends on distance $y_1$ and $z$, the number of LRS PRAM that are placed on the bitline. The sensed read signal in an LRS cell is:

$$I_{LRS-sense} = I_{RR} - I_{sneak-RR} + I_{additive-RR} \quad (13)$$

$$= \left(1 - \frac{zNy_1 R_{BL}}{zNy_1 R_{BL} + (N+\alpha)R_L} + \frac{zy_1 R_{BL}}{MN y_1 R_{BL} + \beta(N+\alpha)R_L}\right) I_{RR}$$

In HRS cells that are not resistive or have escaping currents, the received signal is the additive noise:

$$I_{HRS-Sense} = I_{additive-RR} = z \frac{y_1 R_{BL}}{MN y_1 R_{BL} + (N+\alpha)\beta R_L} I_{RR} \quad (14)$$

The margin between the sensed currents closes as wordline become farther from the sense-amplifier and as more LRS resistors are placed in the same bitline:

$$I_{Margin} = I_{RR} - I_{sneak-RR}(y_1) = \left(1 - \frac{zNy_1 R_{BL}}{zNy_1 R_{BL} + (N+\alpha)R_L}\right) I_{RR} \quad (15)$$

Figure 5:
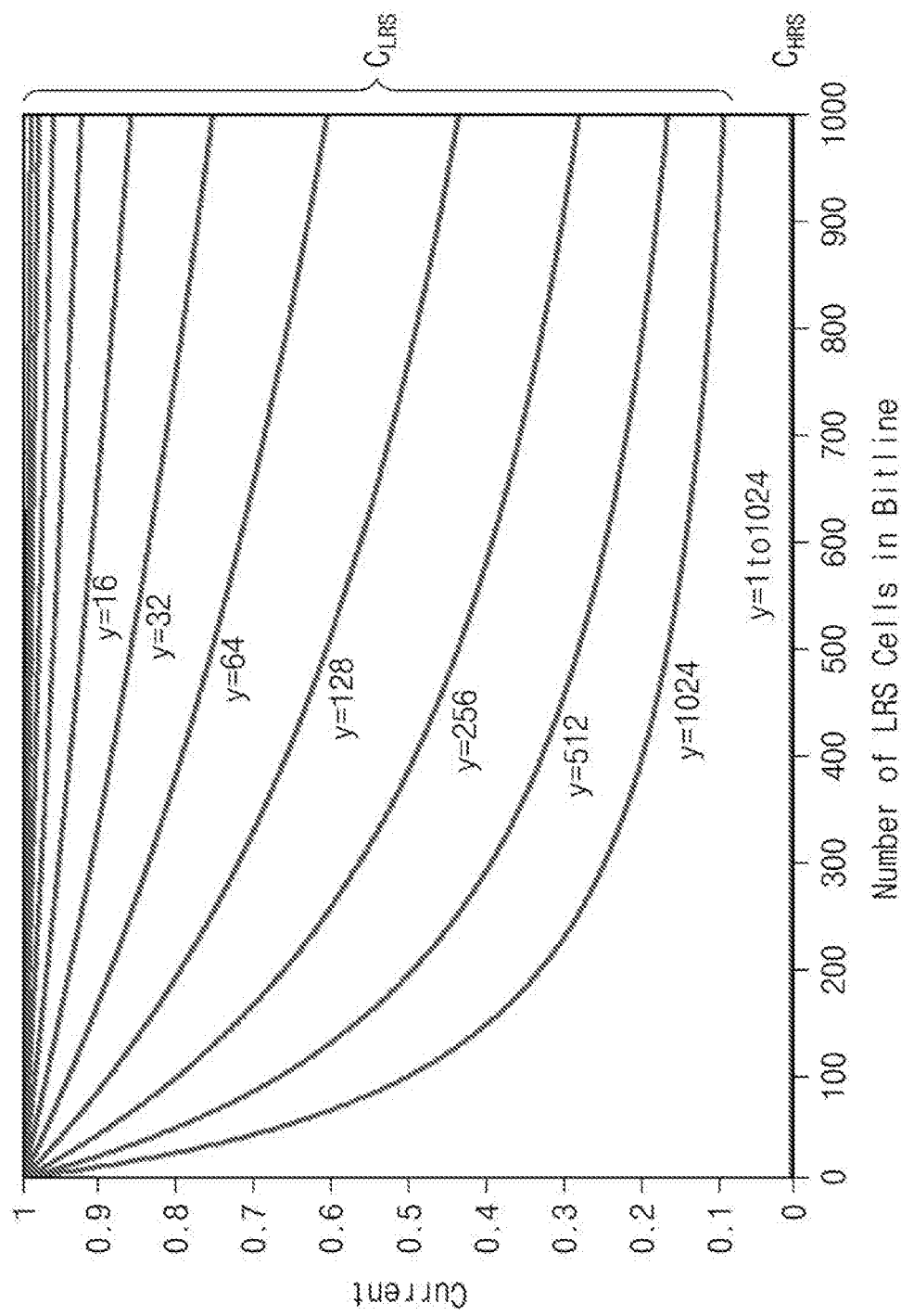
FIG. 5 is a graph of sensed current vs. the number of LRS cells in bitlines for various wordline distances from sense-amplifiers y=1 to 1024, according to an embodiment of the disclosure.
Figure 6:
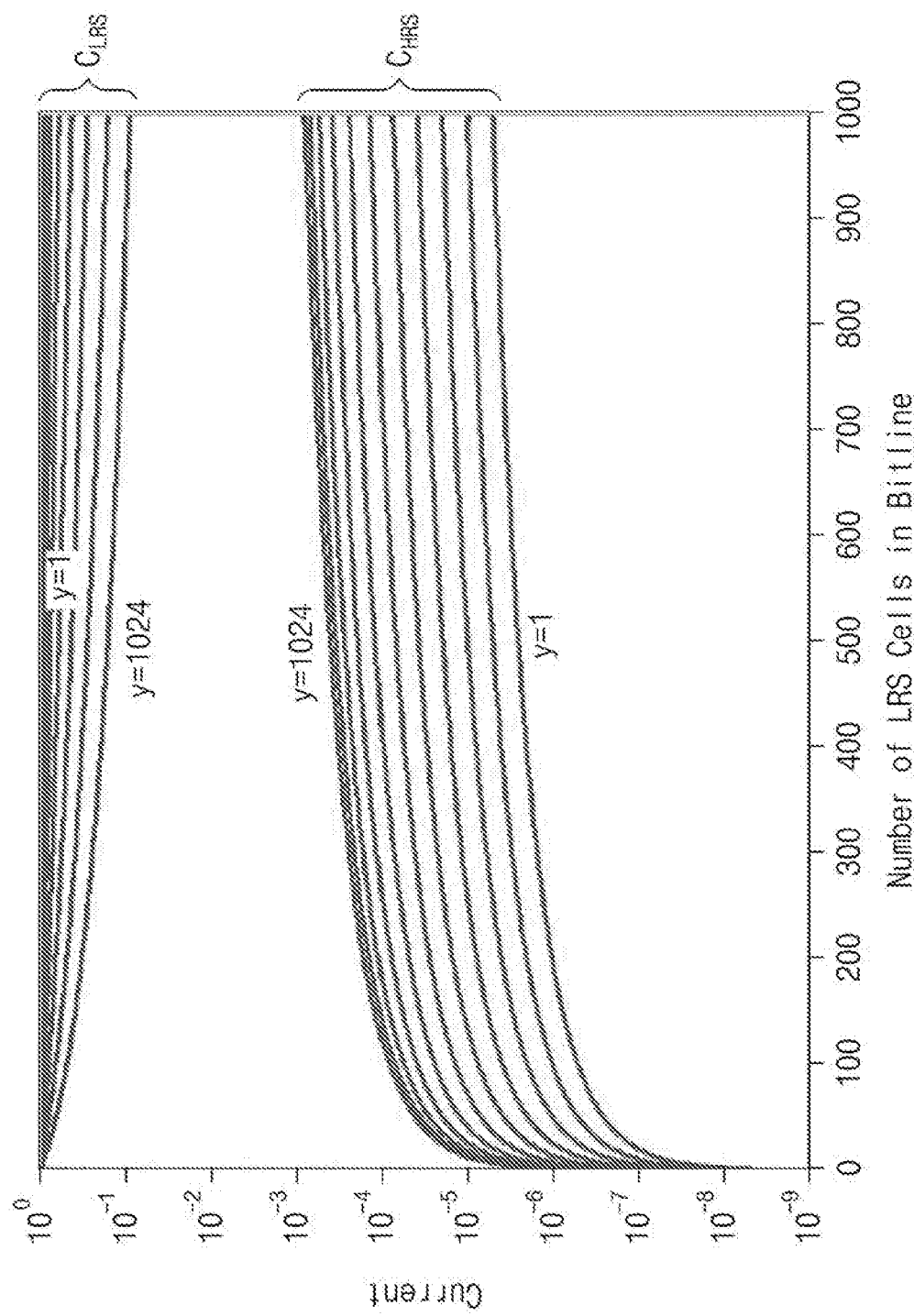
FIG. 6 shows the graphs of FIG. 5 using a logarithmic scale, according to an embodiment of the disclosure.

According to an embodiment, FIG. 5 is a plot of the sensed HRS and LRS PRAM current vs. the number of LRS cells in the bitline, referred to as z, for various wordline distances from sense-amplifiers y=1 to 1024. Line $C_{LRS}$ represent the LRS read current for the values of wordline distances indicated in the figure, and line $C_{HRS}$ represents the HRS read current. The resistance R=1KΩ for LRS, and $R_{BL}=0.01\Omega$ unit length (between PRAM junctions) bitline resistance. The LRS PRAM current is normalized to $I_{RR}=1$ (instead approximately $V_{WL}/R_L$) and Bemoulli-(½) random data distribution has $\alpha=\beta=2$. The block size is 1024×1024 WL×BL. An analysis shows growing noise and reduced read margin with increased distance in the wordline from the sense-amplifier and as more LRS devices are placed in the bitline. It can be seen that the gap between HRS and LRS shrink and offset from the LRS side. While the absolute current reduction is dominant at the LRS signal, the HRS read current changes more significantly, as shown in FIG. 6, which presents the same data as FIG. 5 in a logarithmic scale. Note that HRS current is affected in several magnitudes (up to $10^4$) with the increase in wordline-to-sense-amplifier distance (y). However, the current changes from $10^{-8}$ to $10^{-3}$ of $I_{RR}$ current whereas LRS cells are effected less than a magnitude but actually is reduced from 1 to 0.1 $I_{RR}$ and determine the major impact on BER. Current is normalized to 1 (instead of $V_{WL}/R_L$).

According to an embodiment, to denoise the received data, the wordline location and bitline data is considered. Since bitline data is not always available, a first step is to estimate the read data according to its address, and a second step would be to consider bitline data, if exists.

An algorithm according to an embodiment provides an optimal sense-amplifier current comparison during a read according to wordline address. Its details are described in Algorithm 1, below. Step (1) creates an offline table of current comparisons according to wordline distance from sense amplifier, that is applied at Step (2) to the input read address based on the wordline location. The current $(I_{HRS-SENSE}+I_{LRS-SENSE})/2$ is $$I(y_1) = \quad (16)$$
$$\frac{1}{2}\left(1 - \frac{zNy_1 R_{BL}}{zNy_1 R_{BL} + (N+\alpha)R_L} + \frac{2zy_1 R_{BL}}{MN y_1 R_{BL} + \beta(N+\alpha)R_L}\right) I_{RR}.$$

In an alternative embodiment, EQ. (16) can be formulated using machine learning techniques based on experimental measurements. Exemplary, non-limiting machine learning techniques include regression and neural networks.

In another embodiment, the estimated optimal reference current for a distance closest to the received input read address is selected by a dynamically changing machine learning technique. An exemplary dynamically changing machine learning technique is an actor-critic algorithm.

Figure 7A:
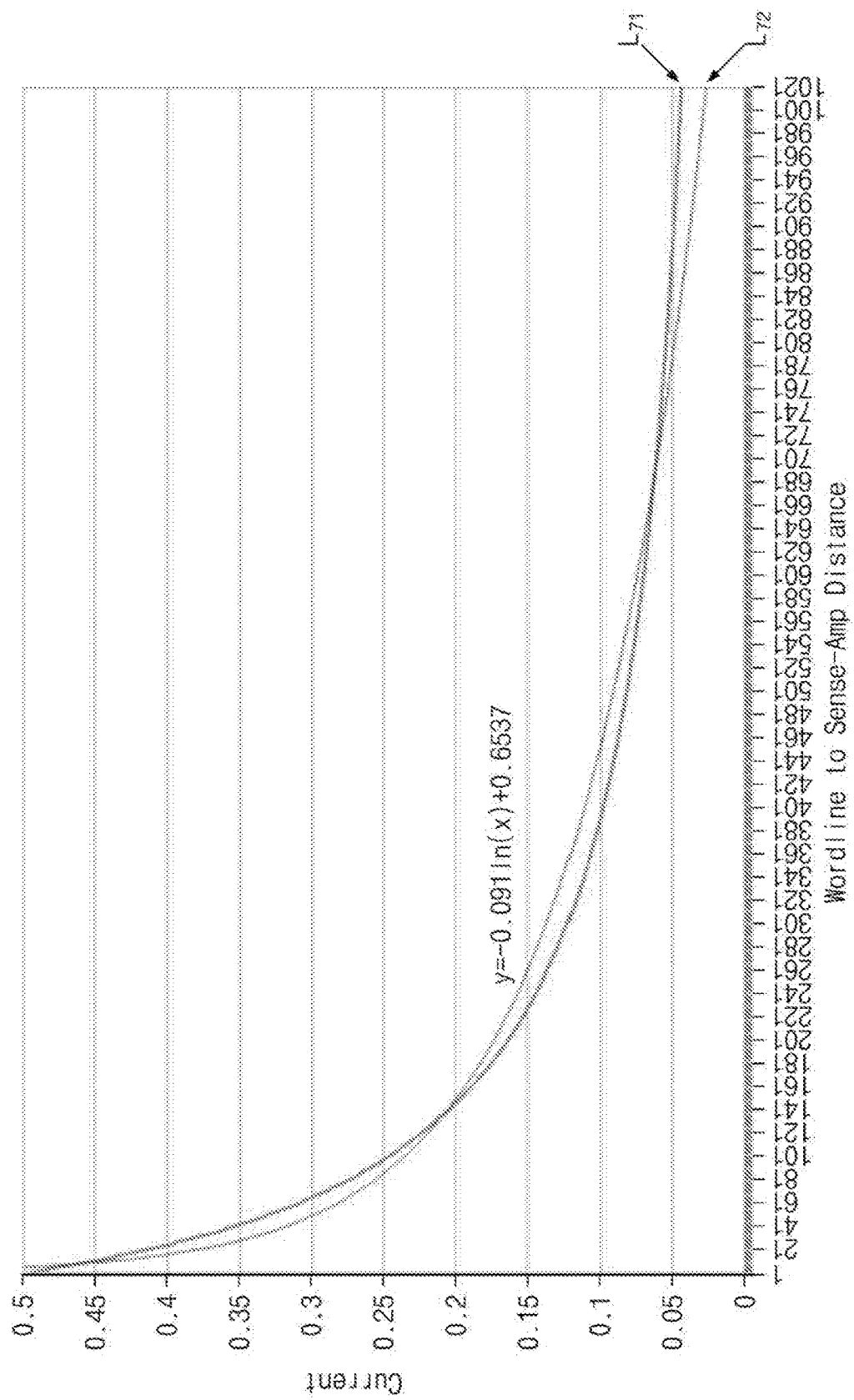

FIG. 7 illustrates a derived current comparison according to wordline-to-sense-amplifier distance using the array parameters of FIG. 5. FIG. 7A is a graph of a full calculation according to Algorithm 1, shown in the line $L_{71}$ and sampled at the table in FIG. 7B, while the line $L_{72}$ is an optimal current. A log-based regression is performed to derive a compact analytical expression for the sense-amplifier current comparison as a function of the wordline-to-sense-amp distance (marked y).

Using log-regression technique, the table can be expressed in the following expression with 97.5% accuracy:

$$(y)=0.653-0.09\cdot(y) \quad (17)$$

According to embodiments, a sense amplifier implementation may compare build-up voltages instead of currents. In this case, the $I_{compare}$ is translated to $V_{compare}$ by multiplying with the proper resistive element.

Algorithm 1: Read Signal Denoising by Address Location
Input: Array dimensions M×N, $R_L$, $R_{BL}$, Address
(1) Create an offline table of wordline distance from the sense-amplifier ($y_1$ location) and the optimal current comparison according to:

$$y1{:}(I_{BRS\text{-}SENSE}+I_{LRS\text{-}SENSE})/2$$

(EQS. 13 and 14, for typical or worst-case z value). Note that table can be described with compact expression of EQ. (17).
(2) Select the current-comparison to sense-amplifier that fits the input read Address Another algorithm according to an embodiment further improves reliability by assigning likelihood values for sensed bits according to the number of LRS PRAMs that are placed on the corresponding bitline. Its details are described in Algorithm 2, below. Such data can be obtained by sequential read or dynamic collection. Note that the last step of decoding or flipping a bit can be performed using any known error-correcting code, such as LDPC.

---

Algorithm 2: Bit Likelihood Assignment according to Bitline Data

Inputs: $Z_i$ the number of LRS PRAMS per bitline i
MN/α, the total number of LRS components in the array
(1) FOR i=1 to page size
  IF $Z_i$=0, Assign likelihood value of being correct of MN+1 to the bit placed at index i
  ELSE, assign likelihood value of being correct of $MN/Z_i\alpha$ to the bit at index i
  END
(2) Decode or flip bits according to obtained values

---

According to embodiments, algorithms 1 and 2 determine a reference current that is used to determine whether the data is '0' or '1' when reading a memory cells. When doing memory read, the memory cell current is compared to reference value to decide between '0' or '1'. Since the sneak paths and parasitic effects are distorting the read current, and algorithms according to embodiment of the disclosure change the reference current value to mitigate the noise effects.

An example of algorithm execution is shown in FIG. 8. According to an embodiment, a 4×4 cross-point block with UH notation is examined for LRS/HRS components. The left side of the figure shows the sneak current from the first $L_{812}$ and $L_{812}$ and second cells $L_{82}$ from the left, while the right side of the figure depicts the sneak currents from the right-most cell $L_{841}$, $L_{842}$ and $L_{843}$. The third cell from the left has no sneak paths since all cells on its bitline are HRS.

The left-most cell has two sneak paths $L_{811}$, $L_{812}$ to the right-most cell, since only first order paths are considered. The second cell from the left has a single current path $L_{82}$ to the fourth cell, which has a total three paths of additive current noise.

Similarly, the first and second cells have two sneak paths $L_{841}$, $L_{842}$ and one sneak path $L_{843}$ from the right-most cell. The total number of LRS is MN/α=4×3/2=6 where the sensed wordline data is not known. The assigned likelihood ratios are: 6/2=3, 6/1=6, 7, 6/3=2. The values are used either for soft-decoding or bit flipping, depending on the noise threshold. In large arrays, Algorithm 2 is expected to be less effective than Algorithm 1 since the variance of LRS cells per bitline is small and about the expected M/i value.

D. Implementation and Mlc Generalization

According to embodiments, hardware support for varying current comparison requires chip's power supply with voltage tuning. Control of sense amplifier reference according to address logic is performed by internal on-chip micro-controller software. Therefore, the implementation overhead is feasible and expected to be of low cost.

According to embodiment, the case of SLC with HRS/LRS has been discussed. However, algorithms according to embodiments can be generalized to multiple-bits per cell (MLC) by taking each two adjacent levels as HRS/LRS, performing analysis and optimizing it separately per each reference point.

Figure 9:
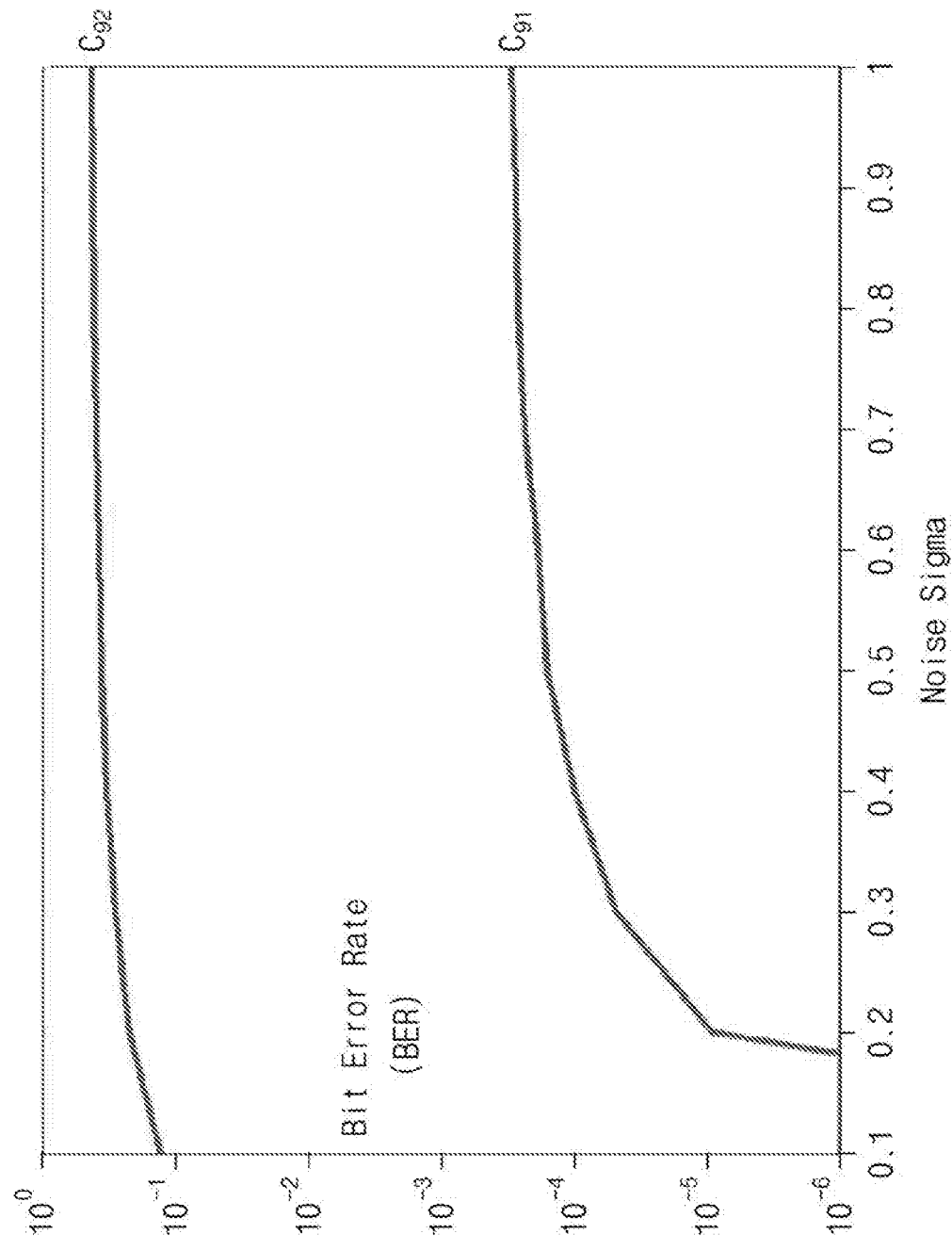
FIG. 9 is a graph of Bit-Error-Rate (BER) vs. Gaussian noise with $\mu$=0 and standard deviation ranging from $\sigma$=0.1 to 1, according to an embodiment of the disclosure.

To demonstrate the gain according to embodiments, Gaussian noise was simulated on PRAM cells resistance with μ=0 and standard deviation ranging from σ=0.1 to 1 on both HRS and LRS cells. A 1024×1024 array was considered with the same parameters that were used for the optimal current comparison calculation. FIG. 9 is a graph of the bit-error-rate (BER) versus the noise sigma. The PRAM array parameters are similar to those in FIG. 5. An optimal (lowest BER) constant reference, represented by line $C_{92}$, was calculated for each σ and compared with a result of wordline-dependent denoising algorithm according to an embodiment, represented as line $C_{91}$, as described in Algorithm 1. A denoising algorithm according to an embodiment can achieve several magnitudes improvement (×1000 and more) in BER, comparing the optimal constant current comparison for each wordline. Note that a further deployment of Algorithm 2 on top of Algorithm will enhance BER even better.

E. System Implementations

It is to be understood that embodiments of the present disclosure can be implemented in various forms of hardware, software, firmware, special purpose processes, or a combination thereof. In some embodiments, the present disclosure can be implemented in hardware as an application-specific integrated circuit (ASIC), or as a field programmable gate array (FPGA). In other embodiments, the present disclosure can be implemented in software as an application program tangible embodied on a computer readable program storage device. The application program can be uploaded to, and executed by, a machine comprising any suitable architecture.

Figure 10:
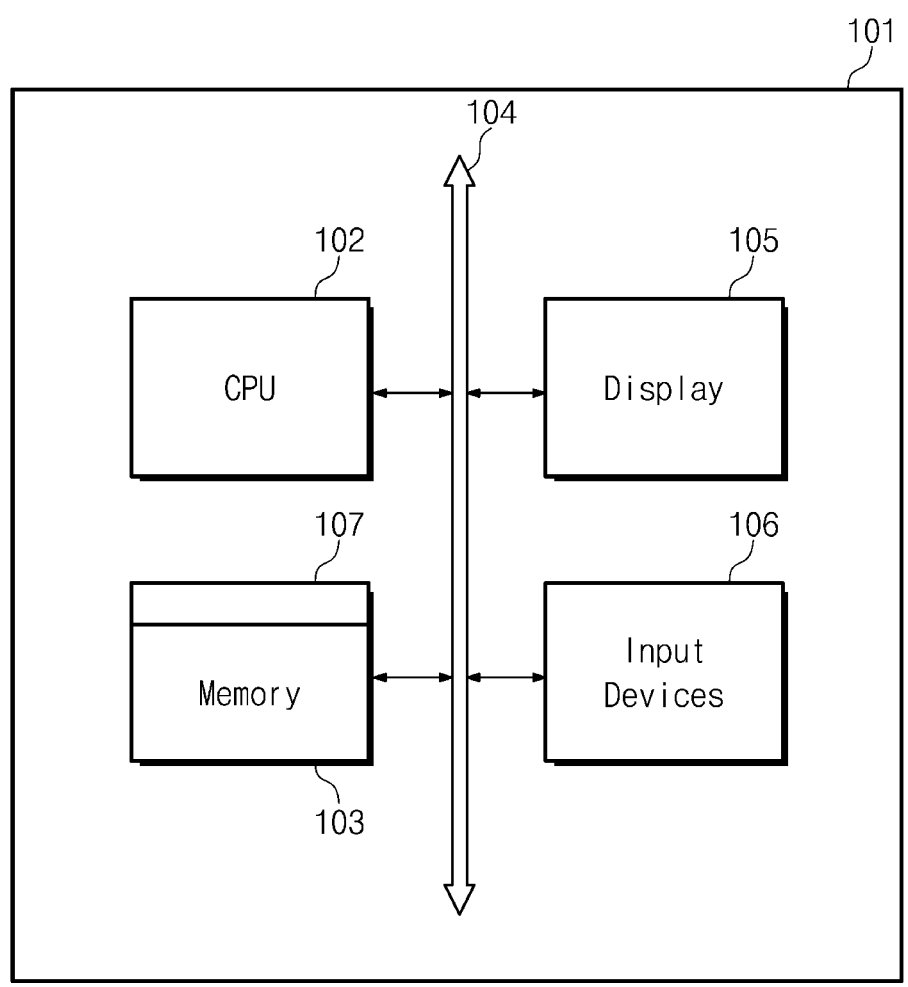
FIG. 10 is a block diagram of a system that implements a method for improving the reliability of read operations in phase change random access memory (PRAM), according to an embodiment of the disclosure.

FIG. 10 is a block diagram of a system that implements a method for improving the reliability of read operations in phase change random access memory (PRAM) according to an embodiment of the disclosure. Referring now to FIG. 10, a computer system 101 for implementing the present invention can comprise, inter alia, a central processing unit (CPU) 102, a memory 103 and an input/output (I/O) interface 104. The computer system 101 is generally coupled through the I/O interface 104 to a display 105 and various input devices 106 such as a mouse and a keyboard. The support circuits can include circuits such as cache, power supplies, clock circuits, and a communication bus. The memory 103 can include random access memory (RAM), read only memory (ROM), disk drive, tape drive, etc., or a combinations thereof. The present disclosure can be implemented as a routine 107 that is stored in memory 103 and executed by the CPU. As such, the computer system 101 is a general purpose computer system that becomes a specific purpose computer system when executing the routine 107 of the present invention. Alternatively, as described above, embodiments of the present disclosure can be implemented as an ASIC or FPGA 107 that is in signal communication with the CPU 102.

The computer system 101 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A method of denoising intrinsic sneak currents in a PRAM memory array of M wordlines and N bitlines, comprising the steps of:
   receiving, by the PRAM memory array, an input read address; and
   selecting a reference current for a distance closest to the received input read address, wherein the reference current determines whether a read current is '0' or '1' and minimizes a bit error rate due to effects of sneak paths and parasitic elements that distorts the read current.

2. The method of claim 1, wherein the reference current for a distance closest to the received input read address is selected from a table of wordline distances from a sense-amplifier versus currents for those wordline distances.

3. The method of claim 2, further comprising generating the table of wordline distances from a sense-amplifier versus currents by calculating, for a plurality of wordline distances $y_1$ from a sense-amplifier, a current $I(y_1)$ from $$I(y_1) = \frac{1}{2}\left(1 - \frac{zNy_1R_{BL}}{zNy_1R_{BL} + (N+\alpha)R_L} + \frac{2zy_1R_{BL}}{MNy_1R_{BL} + \beta(N+\alpha)R_L}\right)I_{RR},$$

wherein $R_{BL}$ is a resistance per unit space of a bitline, $R_L$ is a resistance of a low-resistance cell state of the PRAM, $1/\alpha$ is a constant fraction of low-resistance state cells in a wordline, $\beta$ is a constant fraction of low-resistance state cells in a bitline, and IRR is a current through a sensed low-resistance cell of the PRAM.

4. The method of claim 3, further comprising log-regressing the currents $I(y_1)$ and distances $y_1$ to determine $I(y_1)$ as a linear function of the $\ln(y_1)$ of the form $I(y)=A-B \ln(y)$, wherein A and B are derived from the log-regression.

5. The method of claim 3, wherein the equation $$I(y_1) = \frac{1}{2}\left(1 - \frac{zNy_1R_{BL}}{zNy_1R_{BL} + (N+\alpha)R_L} + \frac{2zy_1R_{BL}}{MNy_1R_{BL} + \beta(N+\alpha)R_L}\right)I_{RR}$$

is derived from experimental data using machine learning.

6. The method of claim 1, wherein the reference current for a distance closest to the received input read address is selected by a dynamically changing machine learning technique.

* * * * *